United States Patent
Peijster

(10) Patent No.: US 9,163,664 B2
(45) Date of Patent: Oct. 20, 2015

(54) GUIDANCE FOR TARGET PROCESSING TOOL

(75) Inventor: Jerry Johannes Martinus Peijster, Maartensdijk (NL)

(73) Assignee: MAPPER LITHOGRAPHY IP B.V., Delft (NL)

(*) Notice: Subject to any disclaimer, the term of this patent is extended or adjusted under 35 U.S.C. 154(b) by 466 days.

(21) Appl. No.: 13/610,398

(22) Filed: Sep. 11, 2012

(65) Prior Publication Data

US 2013/0070225 A1    Mar. 21, 2013

Related U.S. Application Data

(60) Provisional application No. 61/533,339, filed on Sep. 12, 2011.

(51) Int. Cl.
| | |
|---|---|
| F16C 29/00 | (2006.01) |
| G03F 7/20 | (2006.01) |
| F16C 29/04 | (2006.01) |
| F16C 29/12 | (2006.01) |

(52) U.S. Cl.
CPC ............... *F16C 29/002* (2013.01); *F16C 29/04* (2013.01); *F16C 29/123* (2013.01); *G03F 7/2014* (2013.01); *G03F 7/70816* (2013.01); *F16C 2370/00* (2013.01)

(58) Field of Classification Search
CPC ... F16C 29/005; G03F 7/709; G03F 7/70716; G03F 7/707; G03F 7/7075; G03F 7/7095; G03F 7/70758; G03F 7/70775; G03F 7/70816; G03F 7/20; G03F 7/70825
See application file for complete search history.

(56) References Cited

U.S. PATENT DOCUMENTS

| 4,637,738 A | 1/1987 | Barkley |
| 4,802,774 A | 2/1989 | Pesikov |
| 4,993,673 A * | 2/1991 | Hirose .................. 248/176.3 |
| 5,180,230 A * | 1/1993 | McCarthy et al. ........... 384/54 |
| 5,760,564 A | 6/1998 | Novak |
| 6,114,799 A * | 9/2000 | Yoshida et al. ............. 310/328 |
| 2001/0050341 A1 | 12/2001 | Kwan et al. |
| 2003/0053037 A1 | 3/2003 | Blaesing-Bangert et al. |

FOREIGN PATENT DOCUMENTS

| WO | WO 01/78103 A2 | 10/2001 |
| WO | WO 2010/021543 | 2/2010 |
| WO | WO 2013/039387 A1 | 3/2013 |

* cited by examiner

*Primary Examiner* — Mesfin T Asfaw
(74) *Attorney, Agent, or Firm* — Blakely Sokoloff Taylor & Zafman LLP

(57) ABSTRACT

The invention relates to a target processing tool, comprising a target carrier guidance assembly, said target carrier guidance assembly comprising:
 a guide surface having a longitudinal axis in a first direction,
 a target carrier for carrying and displacing a target along said first direction,
 a bearing support mounted to the target carrier by means of a flexible mount,
 a bearing arranged between the guide surface and the bearing support, and
 a biasing element, connected to the target carrier and to the bearing support, adapted for biasing said bearing support along a second direction against the bearing, wherein preferably said second direction is perpendicular to said first direction.

30 Claims, 10 Drawing Sheets

GUIDANCE FOR TARGET PROCESSING TOOL

This is a non-provisional application claiming the benefit of U.S. Provisional Application No. 61/533,339, filed Sep. 12, 2011.

BACKGROUND

The invention relates to a target processing tool, comprising a target carrier guidance assembly, said target carrier guidance assembly comprising a guide surface having a longitudinal axis, a target carrier for carrying and displacing a target along said longitudinal axis, and a bearing arranged between said guide surface and said target carrier for facilitating low-friction movement of the carrier relative to the guide surface. The invention relates in particular to such a target processing tool in which the bearing is mechanical in nature, e.g. comprising one or more ball bearings.

Such processing tools, especially when comprised in a lithography system for patterning a target, are often subjected to substantial changes in temperature. When the guide surface is not sufficiently smooth, or is deformed for example due to thermal expansion, the target carrier may become misaligned with the guide surface, reducing positioning accuracy of the target carrier and increasing wear of the bearings.

It is an object of the present invention to provide a target processing tool with improved tolerance of thermal expansion of the target carrier and/or of the guide surfaces.

SUMMARY OF THE INVENTION

To this end, according to a first aspect, the present invention provides a target processing tool, comprising a target carrier guidance assembly, said target carrier guidance assembly comprising a guide surface having a longitudinal axis in a first direction, a target carrier for carrying and displacing a target along said first direction, a bearing support mounted to the target carrier by means of a flexible mount, a bearing arranged between the guide surface and the bearing support, and a biasing element, connected to the target carrier and to the bearing support, adapted for biasing said bearing support along a second direction against the bearing, wherein said flexible mount is adapted for providing said bearing support with three degrees of freedom of motion relative to said target carrier, including translation along the second direction, and for substantially fixing the remaining degrees of motion. When the target carrier and/or guide surfaces expand or contract, in particular along the second direction, for instance due to thermal expansion, the bearing thus maintains sufficient contact with both the bearing support and the guide surface. Moreover, as the bearing support is only free to move relative to the target carrier in three degrees of freedom of motion, the position and/or orientation of the target carrier relative to the guide surface remains substantially fixed in the remaining three degrees, thus maintaining sufficient contact between the bearing and the bearing support, and between the bearing and the guide surface.

Damage to the bearing due to shear forces thereon caused by misalignment between the bearing and the bearing support is thus substantially prevented. Though in a preferred embodiment the bearing comprises one or more ball bearings, preferably held in a bearing cage for holding the ball bearings when rolling over the guide surface, the bearing may instead comprise other types of bearings adapted for moving over a guide surface, such as friction bearings, e.g. skid surfaces, and/or rolling element bearings.

In an embodiment said degrees of freedom of motion include rotation of said bearing support around an axis parallel to the second direction. During such rotation the distance along the second direction between the bearing support and the guide surface does not substantially change, such that sufficient contact between the bearing and the bearing support, and between the bearing and the guide surface is maintained. When the bearing comprises multiple bearings substantially oriented along the first direction, the present embodiment may compensate for some misalignment between the bearing support and the guide surface. Additionally, the freedom of rotation around an axis parallel to the second direction allows use a flexible mount comprising single-part struts or flexures, instead of for instance hinges having moving parts, providing a more compact and simple construction.

In an embodiment said degrees of freedom of motion include rotation of said bearing support around an axis normal to said first direction and said second direction. Slight variations in smoothness of the guide surface may thus be compensated for. In particular, when the bearing comprises multiple ball bearings, the bearing support may thus bias all of these ball bearings against the guide surface even when a surface of the bearing support contacting said one or more bearings and the guide surface are not completely parallel with to each other.

In a preferred embodiment, the second direction is substantially perpendicular to said first direction. Thus the biasing element does not exert a substantial force on the target carrier and guide/surface along said first direction.

In an embodiment the biasing element is adapted for biasing said bearing support along said second direction against the bearing, and thus the bearing along said second direction against the guide surface. Rotation of the target carrier around its Z-axis, which is normal to a supporting surface of the target carrier for supporting the target, is thus substantially prevented. This is of particular importance in target processing tools such as lithography systems to avoid errors in stitching and/or overlay of patterns on a target. Moreover, damage to the bearing due to shear forces thereon caused by misalignment between the bearing and the guide surface is substantially prevented.

In an embodiment said guide surface is a first guide surface and said bearing support is a first bearing support, said target carrier assembly further comprising a second guide surface parallel to said first guide surface, a second bearing support statically mounted to the target carrier and a second bearing facing said second guide surface. Both the first and the second guide surfaces thus provide a surface for guiding movement of the target carrier. Even when the first and second guide surfaces are not completely parallel, or when they are not completely planar, movement of the target carrier along the first direction will substantially follow the second guide surface. The second guide surface thus provides a reference surface which is followed by the bearings supported by the statically mounted bearing support. Any deformations in the first and/or second guide surface are substantially compensated for by movement of the first bearing support relative to the target carrier. As a result, the requirements on aligning the guide surfaces relative to each other may be relaxed. Moreover, the requirements on planarity, or flatness, of the guide surfaces may be relaxed as well. Preferably the target carrier is substantially supported by the first and second guide surfaces, preferably such that substantially all of the weight of the target carrier and a target thereon is supported, via the flexible mount and the bearings of the first bearing support and via the bearings of the second bearing support, by the first and second guide surfaces.

In an embodiment said biasing element is further adapted for biasing said second bearing support along said second direction against the second bearing, and thus the second bearing along said second direction against the second guide surface. Using a biasing element or a number of biasing elements, both the first and second bearing support are biased against their respective guide surfaces, providing excellent contact between the second bearing and the second bearing support and between the second bearing and the second guide surface. As the present embodiment ensures that the bearings, their respective guide surfaces and their respective bearing support remain sufficiently aligned and maintain sufficient contact, driving movement of the target carrier along the first direction may be effected using only a single actuator.

In an embodiment the first guide surface is arranged on a side of a guide rail and the second guide surface is arranged on an oppositely facing side of said guide rail.

In an embodiment the first guide surface is arranged on a side of a first guide rail and the second guide surface is arranged on an oppositely facing side of a second guide rail. The first and second guide rails are preferably substantially parallel to each other, and preferably are formed as substantially straight rails.

In an embodiment the flexible mount comprises a first strut having a first end attached to the target carrier and a second end attached to the bearing support, said first strut extending in the first direction. The strut, which is a flexible strut, allows some movement of the bearing support relative to the target carrier in a plane substantially parallel to the second direction, while substantially restraining movement of the bearing support relative to the target carrier along the first direction. Thus, when the target carrier is moved along the first direction, the bearing support will follow said movement, and vice versa.

In an embodiment the flexible mount further comprises a second strut having a first end attached to the target carrier and a second end attached to the bearing support, said second strut extending substantially perpendicular to the second direction. The second strut substantially constrains movement of the bearing support relative to the target carrier along a direction normal to the first and second directions. Thus, when the target carrier comprises a support surface for carrying a target, wherein the support surface is parallel to a plane spanned by the first and second directions, and has a Z-axis normal to said plane, the second strut substantially constrains translation of the target carrier relative to the bearing support along the Z-axis of the target carrier.

In an embodiment the flexible mount further comprises a third strut spaced apart from said second strut and having a first end attached to the target carrier and a second end attached to the bearing support, said third strut extending substantially perpendicular to the second direction. Like the second strut, the third strut substantially constrains displacement of the target carrier relative to the bearing along the Z-direction.

In an embodiment the second strut and the third strut are substantially parallel to each other. The second and third struts together with the target carrier and the bearing support are thus connected in a parallelogram like fashion. This construction substantially constrains rotation of the bearing support around an axis parallel to the first direction. It is thus prevented that the distance along the second direction of the bearing support to the guide surface changes non-uniformly due to rotation of the bearing support relative to the target carrier around an axis parallel to the first direction.

In an embodiment the first strut is substantially normal to a plane spanned by said second and third strut. Preferably, the second ends of the first, second and third struts are at substantially the same distance from the target carrier along said plane spanned by the second and third strut, such that the second ends of the first, second and third struts may be jointly moved along the second direction when the first, second and third struts flex.

In an embodiment said first, second and/or third strut is at least substantially rigid in a longitudinal direction of said respective strut. The struts are thus substantially constrained from extending or contracting along their respective longitudinal directions.

In an embodiment said first, second and/or third strut is flexible in a direction substantially perpendicular to the longitudinal direction of said respective strut.

In an embodiment the bearing extends along a longitudinal axis of said bearing substantially parallel to said first direction, wherein said second end of said first strut is arranged in a plane in which said longitudinal axis lies and which plane extends normal to said first and second direction. E.g. when the first and second directions are the Y- and X-directions respectively, then the second end of the first strut lies in a plane parallel to Z and intersecting the longitudinal axis of the bearing. As the first strut is thus aligned with the longitudinal axis of the bearing it follows changes in orientation of the longitudinal axis of the bearing relative to the target carrier more easily.

When projected onto a plane spanned by the first and second direction, e.g. when projected onto the XY plane, the second end of the first strut is preferably spaced apart from the second ends of the second and third struts, and preferably bisects a line connecting the second ends of the second and third struts.

In an embodiment the bearing extends over a length along a longitudinal axis of said bearing substantially parallel to said first direction, and said second ends of said second and third struts are arranged in a plane normal to said first direction and second direction and halfway along said length. E.g. when the first direction and second direction are the X- and Y-directions respectively, then when viewed in projection on the XY-plane, the second ends of the second and third struts are arranged on a line parallel to the X-direction which line lies halfway along the length of the bearing. The center of rotation around the Z-axis is thus defined as halfway on the line connecting the second ends of the second and third struts.

In an embodiment the bearing extends substantially over the entire length of the bearing support in the first direction. The bearing for instance comprises a number of ball-bearings arranged in a line along the first direction, or a slide-bearing which extends along the first direction. In any case, the longitudinal axis of the bearing thus remains substantially parallel to the guide surface when pressed against the guide surface by biasing element.

In an embodiment the bearing extends over a length along a longitudinal axis of said bearing substantially parallel to said first direction, and wherein said flexible mount is arranged for allowing rotation of the bearing support relative to the target carrier around an axis of rotation normal to said first and second direction, which axis of rotation substantially intersects said longitudinal axis, preferably substantially halfway along the length of said bearing. This location of the axis of rotation is well defined and on average minimizes displacement of the bearing support relative to the target carrier when the bearing support is rotated around the axis of rotation.

In an embodiment the target carrier comprises a planar support surface for supporting said target thereon, wherein said planar support surface is substantially parallel to a plane spanned by said first and second directions.

In an embodiment said biasing element is a spring oriented substantially along said second direction. Thus, a sufficiently strong force may be exerted by the spring which force presses the bearing support and the guide surface against the bearing to support the target carrier. In particular, the force exerted by the spring may be sufficient to counteract a further force exerted by target carrier on the bearing or bearings, for instance due to a force of gravity directed along a direction normal to the first and second directions.

In an embodiment the flexible mount is adapted for keeping a total contact area between the bearing support and the bearing substantially constant during movement of the bearing support relative to the target carrier, and for keeping a total contact area between the bearing and the guide surface substantially constant during movement of the bearing support relative to the target carrier. Thus, the total contact area between the bearing support and the bearing and between the bearing and the guide surface is substantially independent from degrees of thermal expansion of the target carrier, bearing support and/or guide surface.

In an embodiment said guide surface comprises a groove extending along said first direction, and said bearing comprises a ball bearing or a plurality of ball bearings adapted for at least partially fitting in said groove. Preferably, the bearing comprises a plurality of ball bearings held in a bearing cage and adapted for moving along said first direction relative to the guide surface and to the bearing support.

In an embodiment the target processing tool further comprises an actuator for driving movement of the target carrier relative to the guide surface, preferably along said first direction.

In an embodiment said bearing and said bearing support extend along said first direction, wherein said bearing is arranged for contacting multiple points of said guide surface along said first direction.

According to a second aspect, the present invention provides a target processing tool, comprising a target carrier guidance assembly, said target carrier guidance assembly comprising:

a guide surface having a longitudinal axis in a first direction, a target carrier for carrying and displacing a target along said first direction, a bearing support mounted to the target carrier by means of a flexible mount, a bearing arranged between the guide surface and the bearing support, and a biasing element, connected to the target carrier and to the bearing support, adapted for biasing said bearing support along a second direction against the bearing.

According to a third aspect the present invention provides a target guidance assembly suitable for a target processing tool as described herein.

According to a fourth aspect the present invention provides a lithography system for patterning a target using one or more beams, comprising a target guidance assembly as described herein.

In an embodiment, said lithography system is adapted for patterning said target during movement of the target carrier within the system.

In an embodiment, said lithography system further comprises:

a projection module for projecting said one or more beams onto the target, a positioning module comprising said target guidance assembly, and a controller for controlling said positioning module to provide scanning movement of the target carrier relative to the projection module along said first direction and along a second direction while said one or more beams are projected from the projection optics onto the target.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
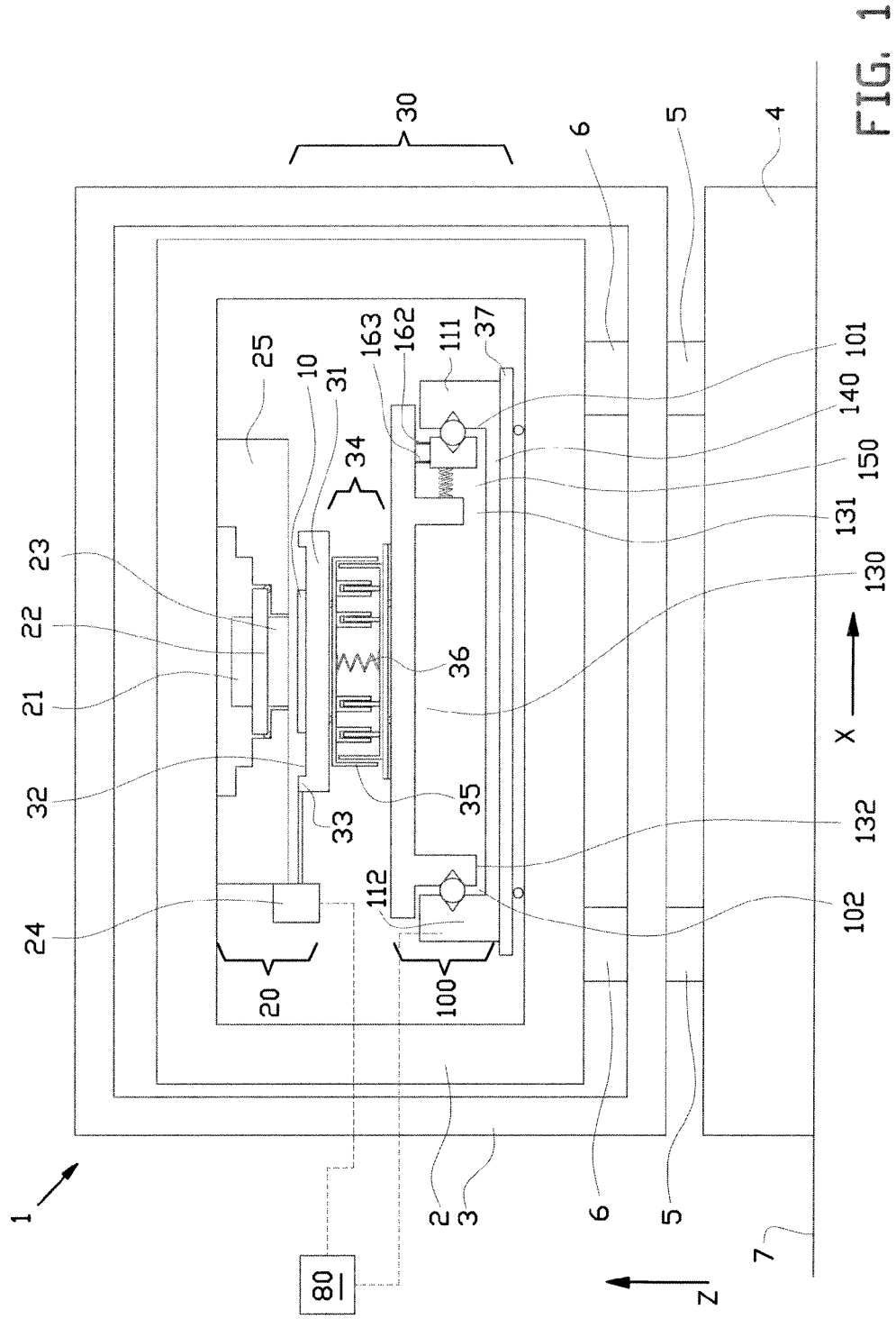
FIG. 1 schematically shows a side view of a target processing tool according to the present invention, FIGS. 2A and 2B schematically show an isometric view of embodiments of a target guidance assembly of a target processing tool according to the invention, in an X-Y-Z coordinate system, FIGS. 3A and 3B schematically show a detail of the target guidance assembly of FIGS. 2A and 2B respectively, FIGS. 4A and 4B each show an alternative embodiment of a bearing support for a target processing tool according to the invention.

FIG. 1 shows a side view of a target processing tool according to the invention, in the form of a lithography system 1. The lithography system 1 comprises a frame 2 which is arranged inside a vacuum chamber 3 and supports a target positioning module 30 adapted for accurately positioning a target 10 relative to projection module 20. The lithography system 1 rests on a base plate 4 which substantially completely supports the lithography system. The base plate 4 comprises a large concrete slab to reduce propagation of high frequency vibrations from the floor 7 to the vacuum chamber 3, in particular to the frame 2 therein to which projection module 20 and target positioning module 30 are mounted. The vacuum chamber 3 is mounted on the base plate 4 via vibration isolators 5, and the frame 2 is mounted on the vacuum chamber 3 via vibration isolators 6.

The projection module 20 comprises a housing 25 which accommodates a charged particle beam source 21 for generating a plurality of charged particle beams (not shown), a modulator array 22, for selectively modulating individual ones of said plurality of charged particle beams, and projection optics 23, comprising a plurality of electrostatic lenses for focusing the beams onto a surface of the target 10. The lithography system thus forms a maskless lithography system, in which the plurality of charged particle beams are selectively modulated by the modulation array while the target is being moved relative to the projection optics using the target positioning module 30.

The target positioning module 30 comprises a target table 31 comprising a support surface 32 for supporting the target 10, which target table 31 at an edge is provided with a reflective surface 33 for cooperating with measurement system 24 in the form of an interferometer 24 attached to the projection module 20. A position of the reflective surface 33 relative to the projection module 20 is measured by the interferometer 24 and passed on to a controller 80, here shown outside of the vacuum chamber 3. The controller 80 is adapted for controlling the target positioning module 30 to position the target 10 under the projection module 20 based on the measured position. The controller 80 is adapted for controlling the positioning module 30 to provide scanning movement of the target 10 relative to the projection module 20 along a first direction Y and along a second direction X perpendicular to said first direction Y and substantially parallel to the support surface 32 of the target table 31, in particular during patterning of the target 10, i.e. while beams are projected from the projection optics 23 onto the target 10.

The target table 31 is arranged on a fine motion stage 34 which is adapted for providing small corrections in position of the target table 31 in six degrees of freedom, i.e. translation along and rotation about X,Y,Z. The fine motion stage 34 comprises Lorentz motors 35, which allow accurate and fast positioning of the target table 31, and also provide some dampening and/or isolation of vibrations from the frame 2 to the target table 31. To reduce the load of the target 10 and target table 31 on the Lorentz motors, the fine motion stage 34 is provided with a load compensation spring 36.

The fine motion stage 34 is arranged on a target carrier guidance assembly 100, also denoted y-stage, adapted for displacing the fine motion stage 34 along said first direction Y substantially perpendicular to the X and Z directions. It will be understood that though the target guidance assembly is here shown a y-stage, it may be used as an x-stage as well.

The target carrier guidance assembly 100 in turn is arranged on an x-stage 37 for displacing the fine motion target carrier assembly 100, the fine motion stage 34, the target table 31 and target 10 thereon along the second direction X. Because the fine motion stage is adapted for six degree of freedom positioning of the target table 31 relative to x-stage 37, the controller 80 can control the fine motion stage to compensate for misalignments between the projection optics 23 and the target table 31.

The target carrier guidance assembly 100 comprises guide rails 111,112 which provide substantially straight guide surfaces having longitudinal axes parallel to the first direction Y. The guidance assembly further comprises a target carrier 130, on which the fine motion stage 34 is arranged. A first bearing, in the form of a number of ball bearings 101, is arranged between the guide surfaces of the first guide rail 111 and a first bearing support 140. A second bearing, in the form of a number of ball bearings 102, is arranged between the guide surfaces of the second guide rail 112 and a second bearing support 132 of target carrier 130. The first bearing support 140 is connected to the target carrier 130 by means of a flexible mount, of which struts or flexures 162,163 are visible. The second bearing support 132 is statically attached to the target carrier 130, and in the embodiment shown comprises a same material as the target. A spring 150, which is oriented along the second direction X is connected at one end to first protrusion 131 of target carrier 130, and at another end to the bearing support 140, for exerting a force on said bearing support 140 against said bearing along said second direction X. Thus, when the target carrier and/or one of the guide rails 111,112 deform, for instance due to thermal expansion, the ball bearings 101 and 102 remain pressed against their respective guide surfaces.

Figure 2A:
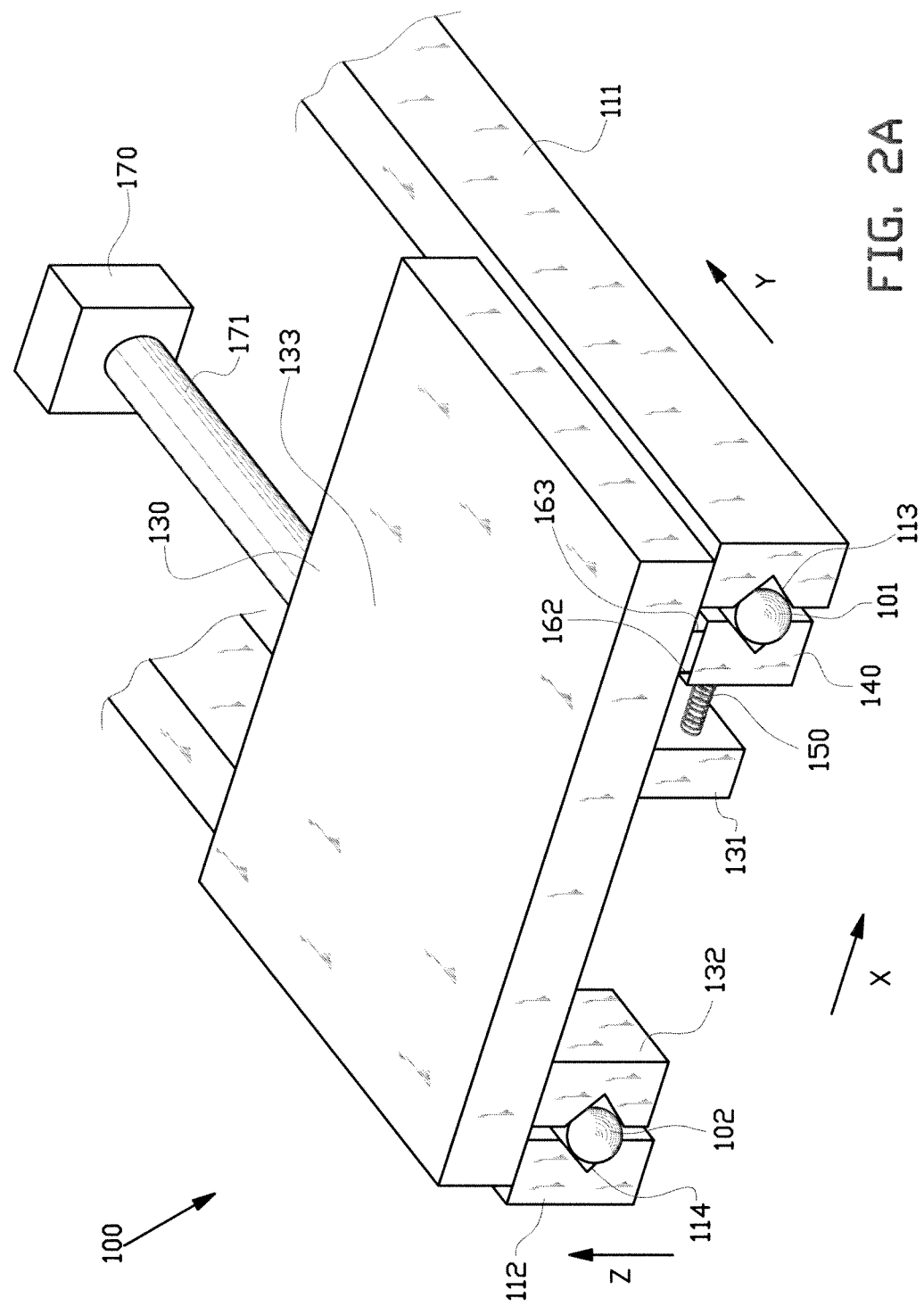

FIG. 2A shows an isometric view of the target carrier guidance assembly 100 of FIG. 1. The first guide rail 111 and second guide rail 112 are provided with guide surfaces 113 and 114 respectively for guiding rolling movement of first and second ball bearings 101 and 102 over the rails. Both the first guide rail 111 and second guide rail 112 are substantially straight, and their respective guide surfaces 113 and 114 are oriented facing toward each other. The target carrier 130 comprises a support surface 133 for supporting a target, i.e. the fine motion stage 34 of FIG. 1. The target carrier 130 is moveable along the longitudinal direction of first and second guide surfaces 113,114 parallel to first direction Y, for displacing the target within a processing tool. Displacement of the target carrier along the first direction Y is effected by a linear actuator 170, which is connected to the target carrier 130 by means of a push-rod 171.

Figure 2B:
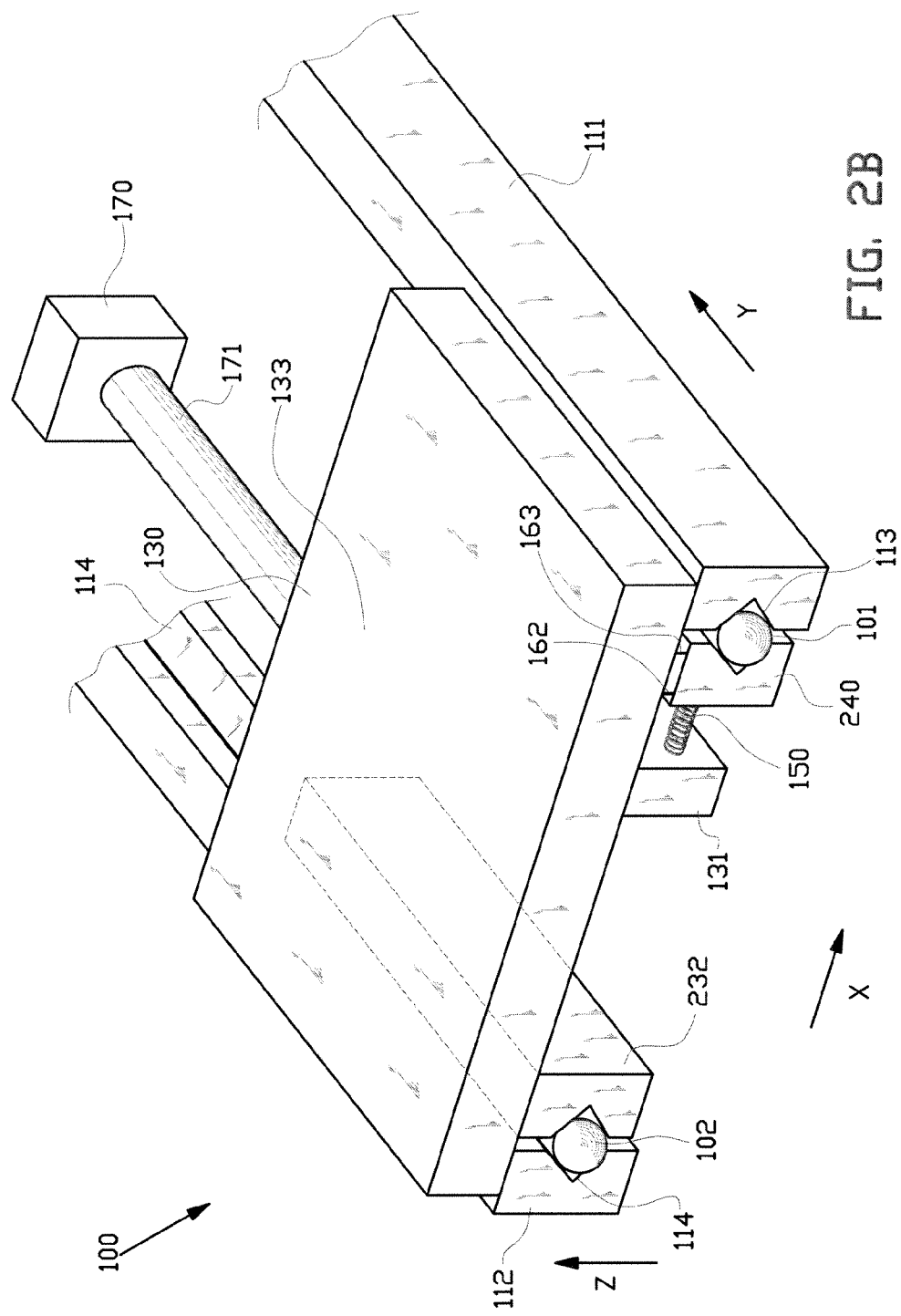

First bearing support 140 is mounted to the target carrier 130 by means of a flexible mount 162,163, which mount is only partly visible in FIGS. 1 and 2A and 2B. A biasing element, here shown in the form of a spring 150, is connected to both the target carrier 130 and to the first bearing support 140, and biases said first bearing support 140 along second direction X against the first ball bearing 101, and thus the first ball bearing 101 along said second direction against the first guide surface 113. The second direction X is substantially perpendicular to the first direction Y, and parallel to a plane spanned by the support surface 133 of the target carrier 130.

The target carrier 130 further comprises a second bearing support 132, which is statically mounted to the target carrier 130, i.e. substantially rotationally and translationally fixed with respect to the target carrier 130, and adapted for exerting a force on a second ball bearing 102 parallel and opposite to the second direction X.

When the target carrier 130, the first guide rail 111, and/or the second guide rail 112 deform slightly, for instance due to thermal expansion, the biasing element 150 ensures that sufficient contact remains between the first ball bearing 101 and the first guide surface 113, and between the first ball bearing 101 and the first bearing support 140. The first ball bearing 101 thus remains correctly aligned between the first guide surface 113 and the first bearing support 140, and excessive shear forces on the ball bearing which might damage the bearing or bearings are avoided. Moreover, a total contact area between the first bearing support 140 and the ball bearing 101 is kept substantially constant during movement of the first bearing support relative to the target carrier, as is a total contact area between the ball bearing 101 and the guide surface 113 substantially constant during movement of the first bearing support 140 relative to the target carrier 130. The first bearing support is here shown with the flexible mount in a neutral orientation, i.e. wherein the struts 162,163 of the flexible mount are substantially straight and not bent.

FIG. 2B shows an alternative embodiment, in which both a first bearing support 240, which is connected to the target carrier by means of flexible mount 162,163, and the second bearing support 232, which is statically mounted to the target carrier, extend substantially over the entire length of the target carrier along the first direction (Y-direction). Though only ball bearings 101 and 102 are shown, both the first bearing support 240 and the second bearing support 240 support a plurality of ball bearings, which pluralities of ball bearings extend substantially along the first direction.

Figure 3A:
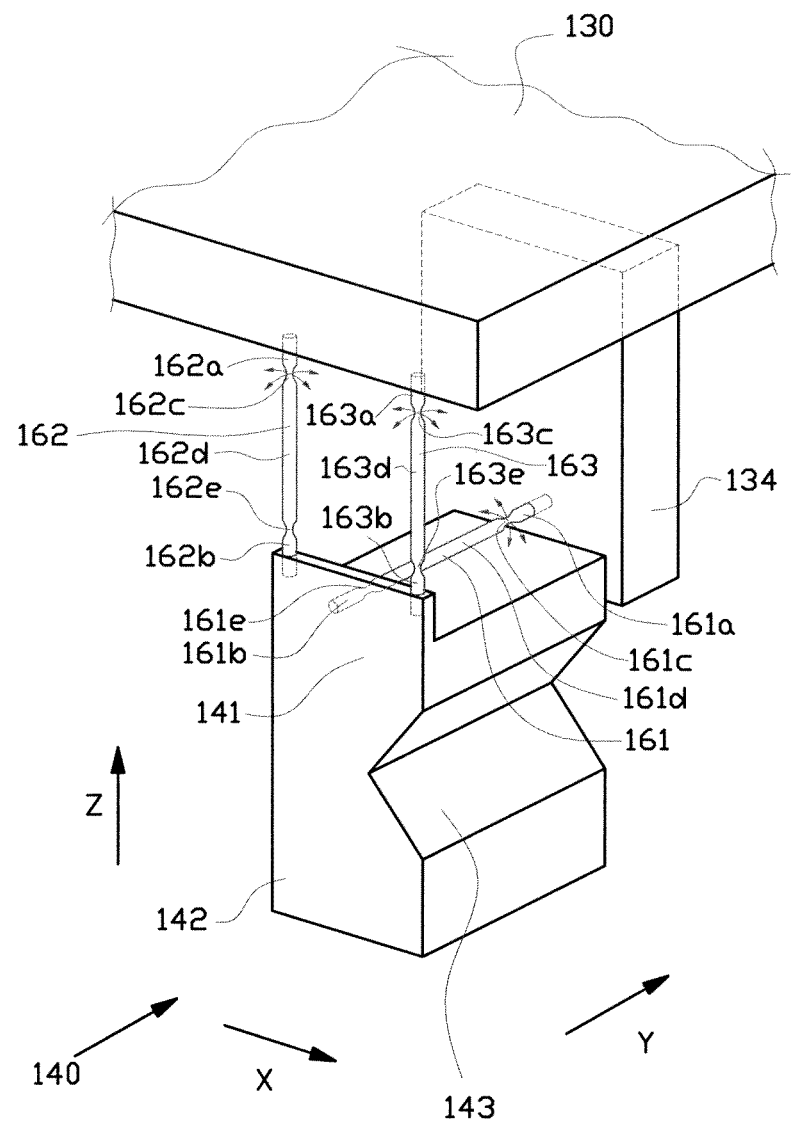

FIG. 3A shows the flexible mount of FIG. 2A in more detail. The flexible mount comprises three flexible struts 161, 162,163, each of which is comprised of a single element, made of a vacuum compatible material, in this case aluminum. The first strut 161 is oriented substantially along the first direction Y and comprises a first end 161*a* attached to a protrusion 134 of the target carrier 130, and a second end 161*b* attached to the bearing support 140. The protrusion 134 is substantially rigid, such that the first strut 161 allows some movement of the bearing support along the second direction X, but substantially constrains movement of the bearing support 140 relative to the target carrier 130 along the first direction Y. In the embodiment shown, the protrusion 134 is an integral part of the target carrier 130.

The second and third struts 162,163 each comprise a first end 162*a*,163*a* attached to the target carrier and a second end 162*b*,163*b* attached to the bearing support 140, and are oriented substantially parallel to each other and normal to the first direction Y and second direction X. The second and third struts 162,163 thus constrain movement of the bearing support 140 along the Z direction, and together with the first strut 161 limit movement of the first bearing support 140 around an axis parallel to the first direction Y. As a result the flexible mount allows at least some freedom of the first bearing support 140 in three degrees of motion relative to the target carrier, i.e. at least some translation along the first direction X, at least some rotation around an axis parallel to the second direction Y, and at least some rotation around an axis normal to the X and Y directions, while substantially constraining motion in the remaining degrees of motion, i.e. translation along the Y- or Z-axis, and rotation along an axis parallel to the Y-axis.

The second end 161*b* of the first strut 161 is connected to the target carrier 130 close to a point on a virtual line from the second end 162*b* of the second strut 162 to the second end 163*b* of the third strut 163.

When the struts 161,162,163 flex, the support structure 140 may be translated along the second direction X, and/or rotated around axes parallel to the second direction X and/or axis Z. The struts 161,162,163, in particular the second and third struts 162,163 are flexible, but remain sufficiently stiff to substantially support weight of the target carrier.

Figure 3B:
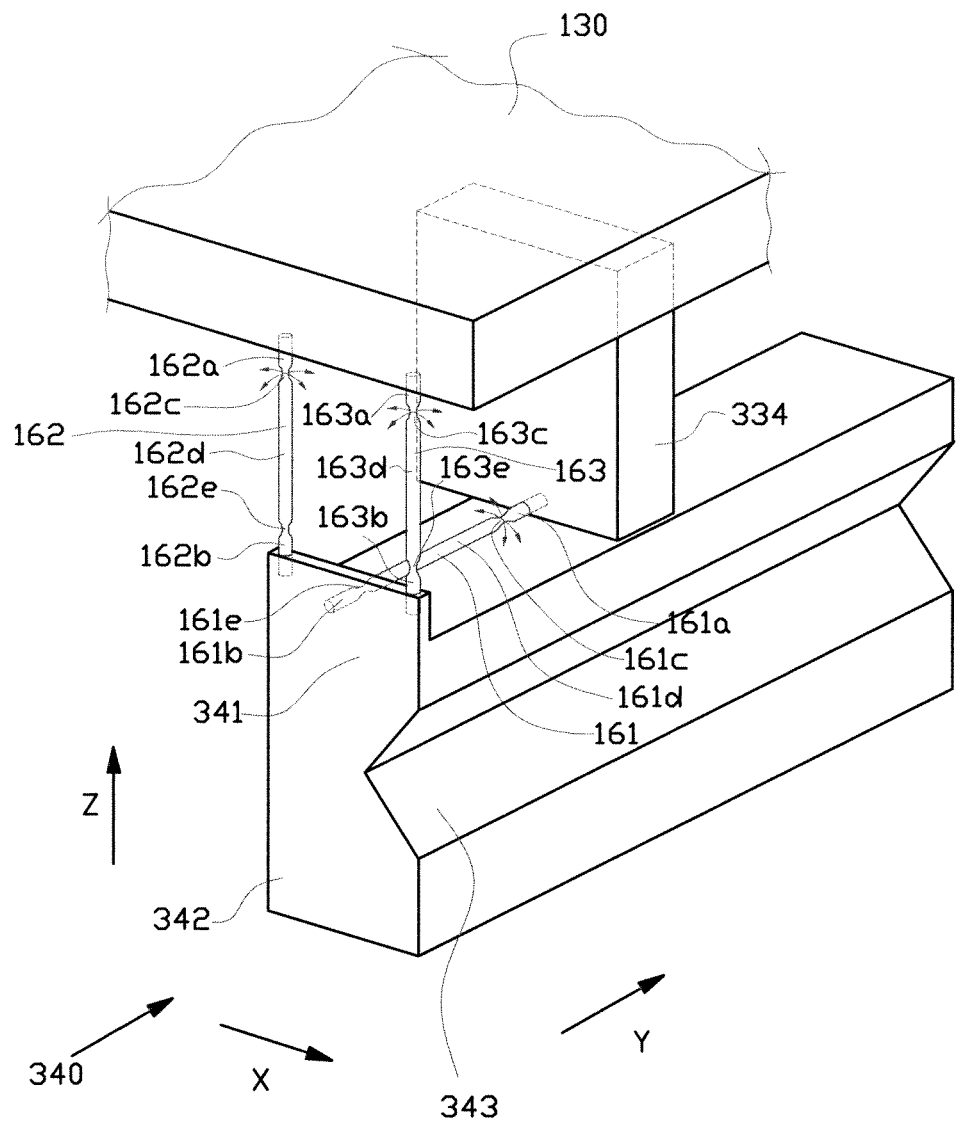

FIG. 3B shows the flexible mount of FIG. 2B in more detail. In this embodiment, bearing support 340 extends over substantially the entire length of the target carrier 130 along the first direction, to provide a relatively large contact surface between the bearings supported by the bearing support, and the guide surface. Protrusion 334, to which the first end of the first strut 161 is connected, is spaced apart from bearing support 340.

Figure 4A:
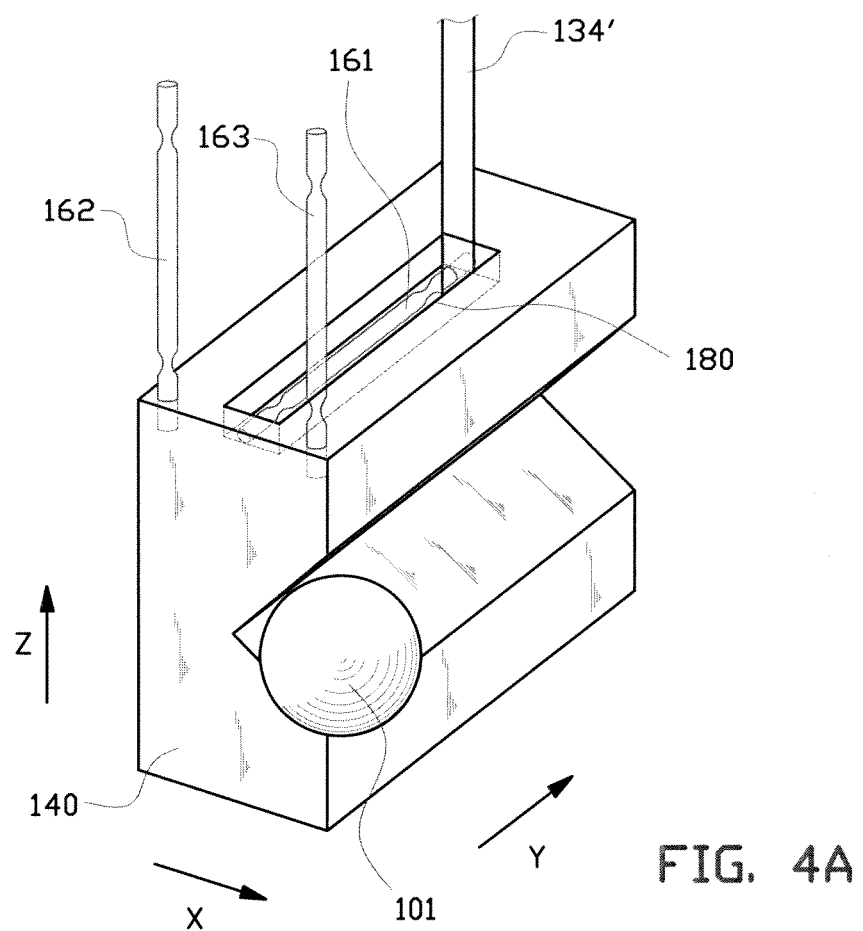

FIG. 4A shows a detail of a bearing support for use in a target processing tool according to the invention, comprising a hollow portion 180 within which the first strut 161 is arranged, and wherein the first strut 161 is spaced apart from walls of said hollow portion 180, allowing the strut 161 to flex within the hollow portion 180. A protrusion 134' of the target carrier (not shown) extends to within the hollow portion 180, yet remains spaced apart there from.

Figure 4B:
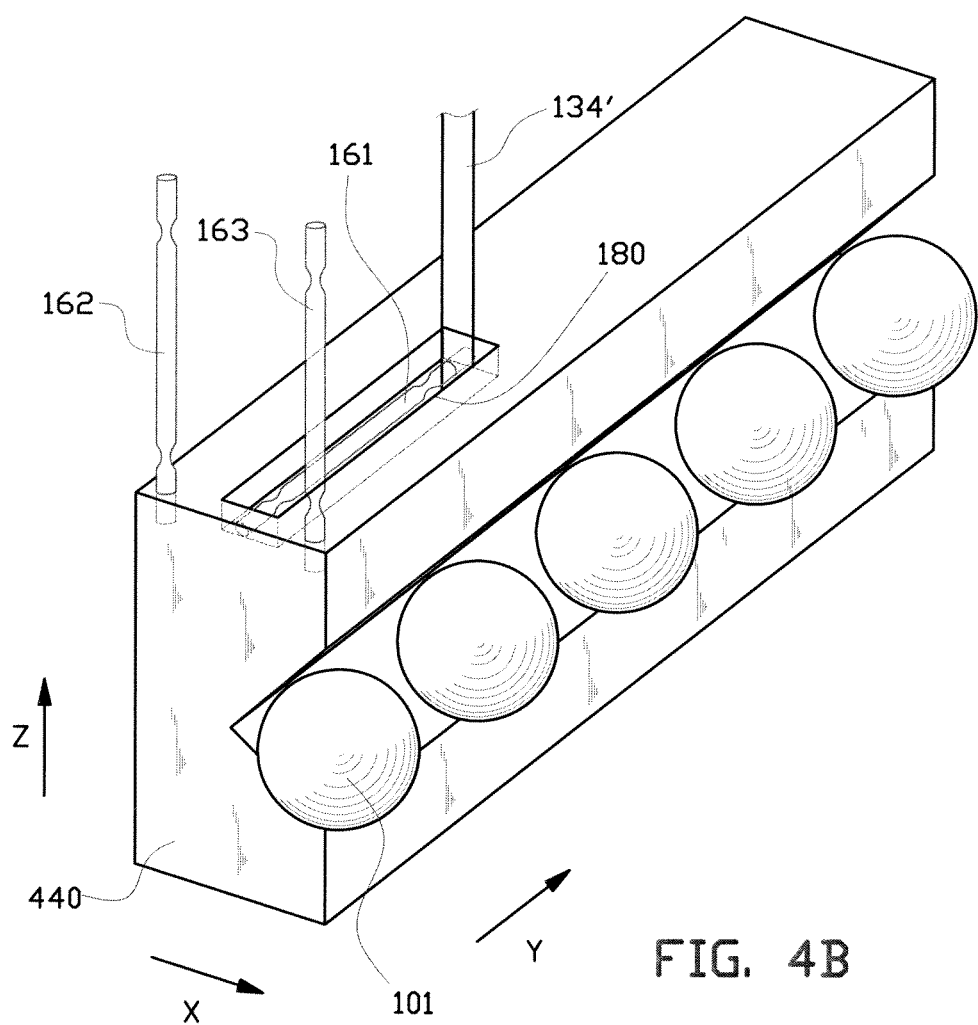

FIG. 4B shows a detail of a bearing support for use in a target processing tool according to the invention, comprising a bearing support 440 which extends over the length of the target carrier in the first direction, and supports a plurality of ball-bearings 101 arranged along a line parallel to the first direction (Y-direction), for providing a larger contact surface between the bearings and the guide surface and for maintaining the plurality of bearings substantially aligned with said first direction.

Figure 5:
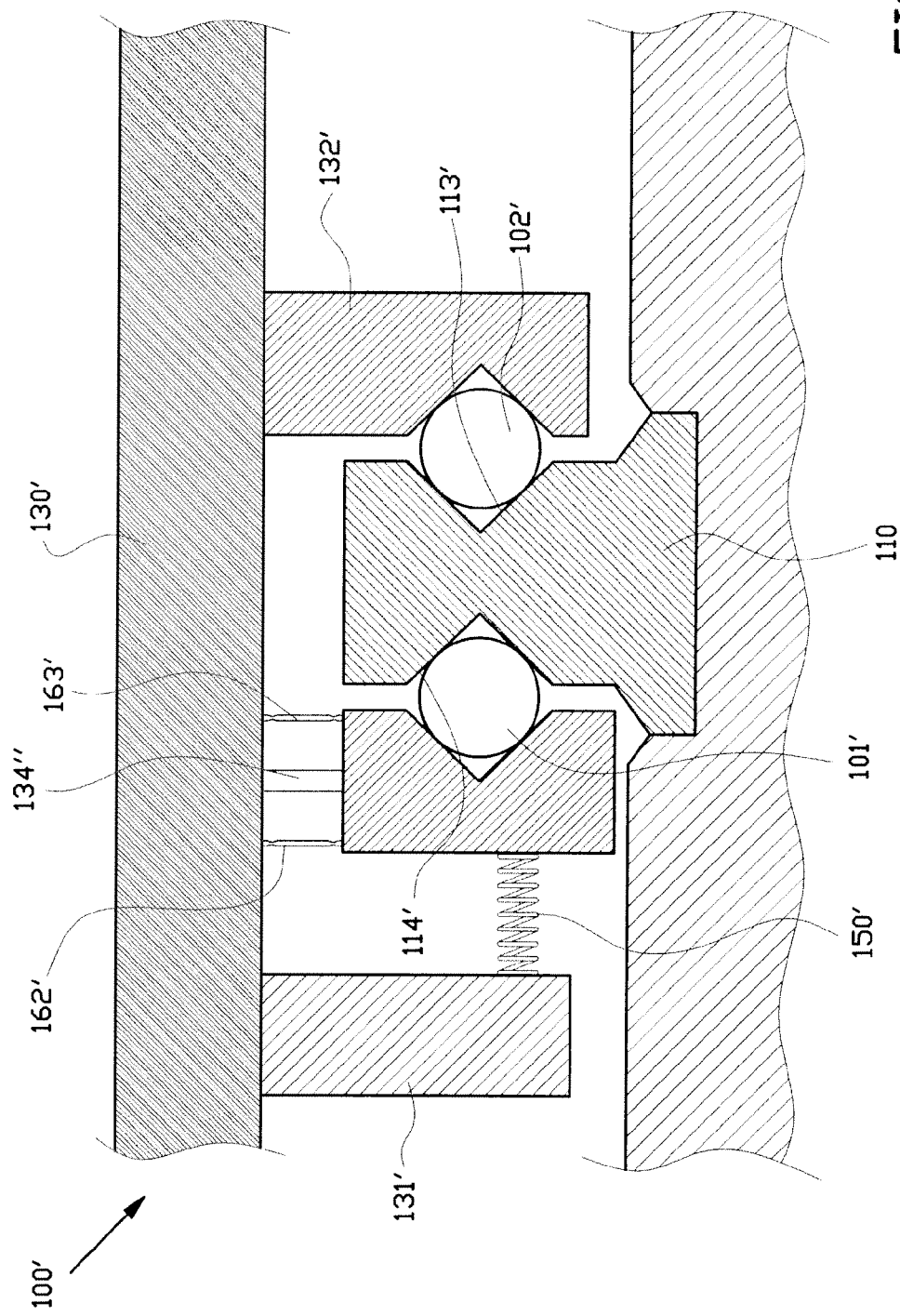
FIG. 5 shows a cross-sectional side view of an embodiment of a target guidance assembly of a target processing tool according to the invention.

FIG. 5 shows a cross-sectional view of a target guidance assembly 100' of a target processing tool according to the invention, comprising a single guide rail 110 provided on one side with a first guide surface 113', and on another, opposite side with a second guide surface 114'. Reference numbers 101',102', 130', 131',132', 134", 150', 162', and 163' correspond with elements indicated by reference numbers 101, 102, 130, 131,132, 134, 150, 162, and 163 respectively of FIGS. 2A,2B and 3A,3B.

Figure 6:
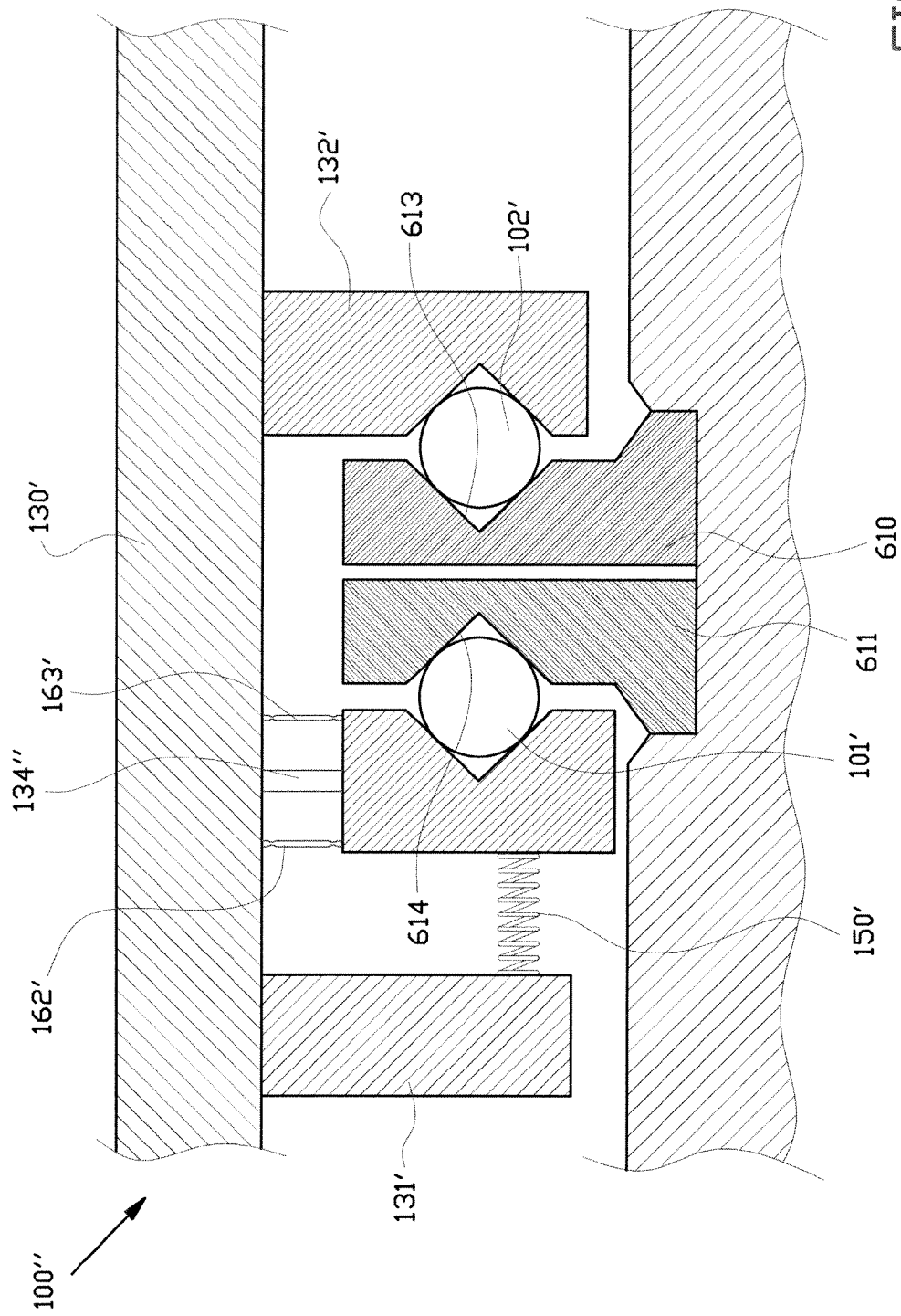
FIG. 6 shows a cross-sectional side view of another embodiment of a target guidance assembly of a target processing tool according to the invention.

FIG. 6 shows a cross-sectional view of a target guidance assembly 100' of a target processing tool according to the present invention, comprising two separate guide rails 610, 611 provided with respective guide surfaces 613 and 614 which face opposite from each other. Bearing 102' is biased against guide second rail 132' by biasing element 150. Thus, movement of the target carrier 130' along the first direction will closely follow the shape and direction of the second guide rail 132. Deformations in shape of the first guide rail 131 or second guide rail 132, and slight misalignments between the two guide rails is compensated for by the flexible mount 162', 163' in combination with biasing element 150.

Figure 7:
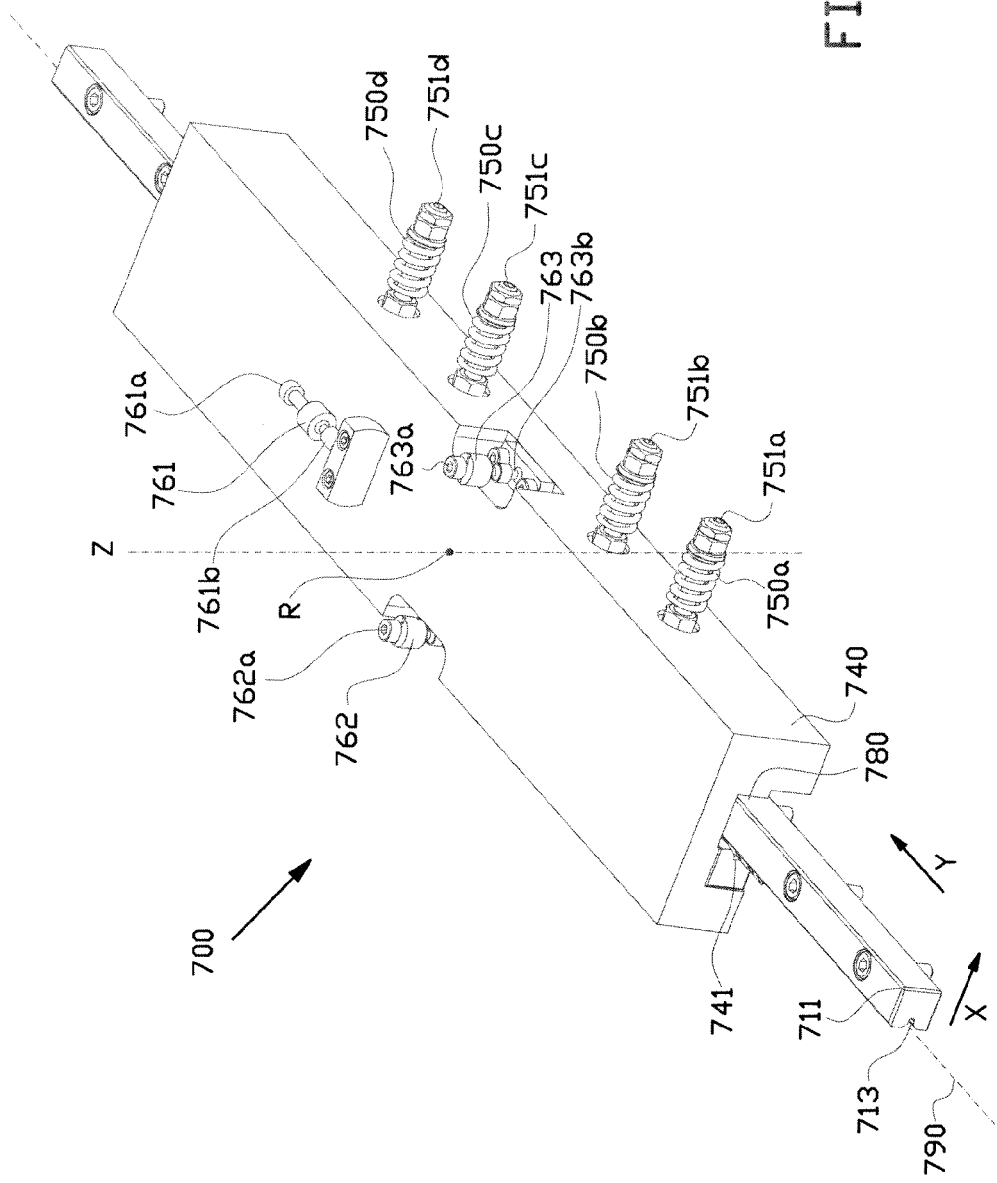
FIG. 7 shows an isometric view of a bearing support according to the invention.

FIG. 7 shows an isometric view of a single bearing support 700 as used in the invention. The bearing support 700 comprises a grooved section 741, with a groove extending along the length of the bearing support along the first direction (Y-direction). Facing the grooved section 741 is a guide rail 711, provided with a guide surface in the form of groove 713. The bearing support 700 supports a number of ball bearings arranged along a line 790 between both grooves. The bearing support further comprises biasing elements 750*a*,750*b*,750*c*, 750*d* in the form of springs, which bias the grooved section 741 towards groove 713 of the guide rail 711. The biasing elements may be tensioned to exert a specific biasing force by turning respective nuts 751*a*,751*b*,751*c* and 751*d*, and are not directly connected to the target carrier (not shown). The target carrier is only connected to the bearing support 700 via first ends 761*a*,762*a*, 763*a* of respective first, second and third struts 761,762,763. The struts are arranged such that they allow rotation of the bearing support relative to the target carrier around an axis parallel to the Z axis, around point R. When projected onto the XY-plane, this point R lies halfway between the second ends 763*b*,762*b* of the second and third struts 762,763, and directly on top of the longitudinal axis 790 of the bearings which are supported between the groove 741 of the bearing support 740 and the guide surface 713 of the guide rail 711. The bearing support and the guide rail are only in contact with each other via the bearings. Sides of the guide rail 711 which are not in contact with the bearings are spaced apart from the bearing support. For instance, there is a gap at the location indicated by reference numeral 780, which allows movement along the second direction (X-direction) of the bearing support 740 relative to the guide rail 711. Likewise, the target carrier (not shown) is only supportingly connected to the bearing support 740 via struts 761,762 and 763.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Target processing tool, comprising a target carrier guidance assembly, said target carrier guidance assembly comprising:
a guide surface having a longitudinal axis in a first direction, a target carrier for carrying and displacing a target along said first direction, a bearing support mounted to the target carrier by means of a flexible mount, a bearing arranged between the guide surface and the bearing support, and a biasing element, connected to the target carrier and to the bearing support, adapted for biasing said bearing support along a second direction against the bearing, characterized in that said flexible mount is adapted for providing said bearing support with three degrees of freedom of motion relative to said target carrier, including translation along the second direction, and for substantially fixing the remaining degrees of motion.

2. Target processing tool according to claim 1, wherein said degrees of freedom of motion include rotation of said bearing support around an axis parallel to the second direction.

3. Target processing tool according to claim 1 or claim 2, wherein said degrees of freedom of motion include rotation of said bearing support around an axis normal to said first direction and said second direction.

4. Target processing tool according to claim 1, wherein said second direction is perpendicular to said first direction.

5. Target processing tool according to claim 1, wherein the biasing element is adapted for biasing said bearing support along said second direction against the bearing, and thus the bearing along said second direction against the guide surface.

6. Target processing tool according to claim 1, wherein said guide surface is a first guide surface and said bearing support is a first bearing support, said target carrier assembly further comprising a second guide surface parallel to said first guide surface, a second bearing support statically mounted to the target carrier and a second bearing facing said second guide surface.

7. Target processing tool according to claim 6, wherein said biasing element is further adapted for biasing said second bearing support along said second direction against the second bearing, and thus the second bearing along said second direction against the second guide surface.

8. Target processing tool according to claim 6 or claim 7, wherein the first guide surface is arranged on a side of a first guide rail and wherein the second guide surface is arranged on an oppositely facing side of a second guide rail.

9. Target processing tool according to claim 6 or claim 7, wherein the first guide surface is arranged on a side of a guide rail and wherein the second guide surface is arranged on an oppositely facing side of said guide rail.

10. Target processing tool according to claim 1, wherein the flexible mount comprises a first strut having a first end attached to the target carrier and a second end attached to the bearing support, said first strut extending in the first direction.

11. Target processing tool according to claim 10, wherein said flexible mount further comprises a second strut having a first end attached to the target carrier and a second end attached to the bearing support, said second strut extending substantially perpendicular to the second direction.

12. Target processing tool according to claim 11, wherein the flexible mount further comprises a third strut spaced apart from said second strut and having a first end attached to the target carrier and a second end attached to the bearing support, said third strut extending substantially perpendicular to the second direction.

13. Target processing tool according to claim 12, wherein the second strut and the third strut are substantially parallel to each other.

14. Target processing tool according to claim 12 or claim 13, wherein the first strut is substantially normal to a plane spanned by said second and third strut.

15. Target processing tool according to claim 10, wherein said first, second and/or third strut is at least substantially rigid in a longitudinal direction of said respective strut.

16. Target processing tool according to claim 10 wherein said first, second and/or third strut is flexible in a direction substantially perpendicular to the longitudinal direction of said respective strut.

17. Target processing tool according to claim 10, wherein said bearing extends along a longitudinal axis of said bearing substantially parallel to said first direction, and wherein said second end of said first strut is arranged in a plane in which said longitudinal axis lies and which plane extends normal to said first and second direction.

18. Target processing tool according to claim 12, wherein said bearing extends over a length along a longitudinal axis of said bearing substantially parallel to said first direction, and wherein said second ends of said second and third struts are arranged in a plane normal to said first direction and second direction and halfway along said length.

19. Target processing tool according to claim 1, wherein said bearing extends substantially over the entire length of the bearing support in the first direction.

20. Target processing tool according to claim 1, wherein said bearing extends over a length along a longitudinal axis of said bearing substantially parallel to said first direction, and wherein said flexible mount is arranged for allowing rotation of the bearing support relative to the target carrier around an axis of rotation normal to said first and second direction, which axis of rotation substantially intersects said longitudinal axis, preferably substantially halfway along the length of said bearing.

21. Target processing tool according to claim 1, wherein the target carrier comprises a planar support surface for supporting said target thereon, wherein said planar support surface is substantially parallel to a plane spanned by said first and second directions.

22. Target processing tool according to claim 1, wherein said biasing element is a spring oriented substantially along said second direction.

23. Target processing tool according to claim 1, wherein the flexible mount is adapted for keeping a total contact area between the bearing support and the bearing substantially constant during movement of the bearing support relative to the target carrier, and for keeping a total contact area between the bearing and the guide surface substantially constant during movement of the bearing support relative to the target carrier.

24. Target processing tool according to claim 1, wherein said guide surface comprises a groove extending along said first direction, and wherein said bearing comprises a ball bearing or a plurality of ball bearings adapted for at least partially fitting in said groove.

25. Target processing tool according to claim 1, further comprising
an actuator for driving movement of the target carrier relative to the guidance surface.

26. Target processing tool according to claim 1, wherein said bearing and said bearing support extend along said first direction, wherein said bearing is arranged for contacting multiple points of said guide surface along said first direction.

27. Target carrier guidance assembly suitable for a target processing tool according to claim 1, said target carrier guidance assembly comprising:

a target carrier guidance assembly, said target carrier guidance assembly comprising:
a guide surface having a longitudinal axis in a first direction,
a target carrier for carrying and displacing a target along said first direction,
a bearing support mounted to the target carrier by means of a flexible mount,
a bearing arranged between the guide surface and the bearing support, and
a biasing element, connected to the target carrier and to the bearing support, adapted for biasing said bearing support along a second direction against the bearing,
characterized in that said flexible mount is adapted for providing said bearing support with three degrees of freedom of motion relative to said target carrier, including translation along the second direction, and for substantially fixing the remaining degrees of motion.

28. Lithography system for patterning a target using one or more beams, comprising a target guidance assembly according to claim 27.

29. Lithography system according to claim 28, adapted for patterning said target during movement of the target carrier within the system.

30. Lithography system according to claim 28, further comprising
a projection module for projecting said one or more beams onto the target,
a positioning module comprising said target guidance assembly, and
a controller for controlling said positioning module to provide scanning movement of the target carrier relative to the projection module along said first direction and along a second direction while said one or more beams are projected from the projection optics onto the target.

* * * * *